United States Patent
Fukushima et al.

(10) Patent No.: US 9,845,528 B2
(45) Date of Patent: Dec. 19, 2017

(54) TANTALUM SPUTTERING TARGET

(75) Inventors: Atsushi Fukushima, Ibaraki (JP); Kunihiro Oda, Ibaraki (JP); Shinichiro Senda, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1179 days.

(21) Appl. No.: 13/265,566

(22) PCT Filed: Aug. 4, 2010

(86) PCT No.: PCT/JP2010/063194
§ 371 (c)(1),
(2), (4) Date: Oct. 21, 2011

(87) PCT Pub. No.: WO2011/018971
PCT Pub. Date: Feb. 17, 2011

(65) Prior Publication Data
US 2012/0031756 A1    Feb. 9, 2012

(30) Foreign Application Priority Data

Aug. 11, 2009 (JP) ................. 2009-186256

(51) Int. Cl.
C22C 27/02  (2006.01)
C22F 1/18   (2006.01)
C23C 14/34  (2006.01)

(52) U.S. Cl.
CPC .......... *C23C 14/3414* (2013.01); *C22C 27/02* (2013.01); *C22F 1/18* (2013.01)

(58) Field of Classification Search
CPC .......... C22C 27/02; C22C 27/04; C23C 14/14
USPC ....................... 148/422; 204/192.15; 420/427
See application file for complete search history.

(56) References Cited

U.S. PATENT DOCUMENTS

| | | | |
|---|---|---|---|
| 5,693,203 A | 12/1997 | Ohhashi et al. | |
| 6,331,233 B1 | 12/2001 | Turner | |
| 6,348,113 B1 | 2/2002 | Michaluk et al. | |
| 6,348,139 B1 | 2/2002 | Shah et al. | |
| 6,759,143 B2 | 7/2004 | Oda et al. | |
| 6,770,154 B2 | 8/2004 | Koenigsmann et al. | |
| 6,893,513 B2 | 5/2005 | Michaluk et al. | |
| 7,156,963 B2 | 1/2007 | Oda | |
| 7,517,417 B2 | 4/2009 | Turner | |
| 7,699,948 B2 | 4/2010 | Oda | |
| 7,716,806 B2 | 5/2010 | Oda | |
| 7,740,717 B2 | 6/2010 | Oda | |
| 7,892,367 B2 | 2/2011 | Oda | |
| 8,172,960 B2 | 5/2012 | Oda et al. | |
| 8,177,947 B2 | 5/2012 | Miyashita | |
| 8,425,696 B2 | 4/2013 | Oda et al. | |
| 2005/0155677 A1 | 7/2005 | Wickersham, Jr. | |
| 2005/0230244 A1* | 10/2005 | Inoue et al. | 204/298.13 |
| 2007/0102288 A1 | 5/2007 | Oda et al. | |
| 2009/0032392 A1 | 2/2009 | Miyashita | |
| 2009/0134021 A1 | 5/2009 | Oda et al. | |
| 2011/0266145 A1 | 11/2011 | Fukushima et al. | |
| 2012/0031756 A1 | 2/2012 | Fukushima et al. | |
| 2012/0037501 A1 | 2/2012 | Fukushima et al. | |
| 2013/0092534 A1 | 4/2013 | Senda et al. | |
| 2013/0098759 A1 | 4/2013 | Senda et al. | |
| 2014/0242401 A1 | 8/2014 | Senda et al. | |

FOREIGN PATENT DOCUMENTS

| | | | |
|---|---|---|---|
| EP | 0902102 A1 | 3/1999 | |
| JP | 11-080942 | * 3/1999 | ............. C23C 14/34 |
| JP | 2000-212678 A | 8/2000 | |
| JP | 2002-060934 A | 2/2002 | |
| JP | 2005-336617 A | 12/2005 | |

OTHER PUBLICATIONS

English Abstract and English Machine Translation of Kanano et al. (JP 11-080942), Mar. 26, 1999.*
"Ultrapure Refractory Metals Used in Microelectronics", Metal Powder Report, vol. 44, No. 7/8, pp. 543-544, Jul. 1989.

* cited by examiner

*Primary Examiner* — Jessee Roe
(74) *Attorney, Agent, or Firm* — Howson & Howson LLP

(57) ABSTRACT

Provided is a tantalum sputtering target containing 1 mass ppm or more and 100 mass ppm or less of tungsten as an essential component, and having a purity of 99.998% or more excluding tungsten and gas components. Additionally provided is a tantalum sputtering target according to according to the above further containing 0 to 100 mass ppm of molybdenum and/or niobium, excluding 0 mass ppm thereof, wherein the total content of tungsten, molybdenum, and niobium is 1 mass ppm or more and 150 mass ppm or less, and wherein the purity is 99.998% or more excluding tungsten, molybdenum, niobium and gas components. Thereby obtained is a high purity tantalum sputtering target comprising a uniform and fine structure and which enables stable plasma and yields superior film evenness (uniformity).

18 Claims, No Drawings

TANTALUM SPUTTERING TARGET

BACKGROUND OF THE INVENTION

The present invention relates to a high purity tantalum sputtering target comprising a uniform and fine structure and which yields stable plasma and yields superior film evenness, in other words, uniformity. Note that, the generic term of "high purity tantalum" will be used in the present specification since the high purity tantalum according to the present invention contains (is added with) tungsten, and molybdenum and/or niobium as needed, and the additive amount of these elements is small.

In recent years, the sputtering method for forming a film from materials such as metal or ceramics has been used in numerous fields such as electronics, corrosion resistant materials and ornaments, catalysts, as well as in the manufacture of cutting/polishing materials and abrasion resistant materials.

Although the sputtering method itself is a well-known in the foregoing fields, recently, particularly in the electronics field, a tantalum sputtering target suitable for forming films of complex shapes, forming circuits or forming barrier films is in demand.

Generally, this tantalum target is produced by repeating the hotforging and annealing (heat treatment) of an ingot or billet formed by performing electron beam melting and casting to a tantalum raw material, and thereafter performing rolling and finish processing such as mechanical processing and polishing thereto.

In this kind of production process, the hot forging performed to the ingot or billet will destroy the cast structure, disperse or eliminate the pores and segregations, and, by further annealing this, recrystallization will occur, and the densification and strength of the structure can be improved to a certain degree.

The molten and cast ingot or billet generally has a crystal grain size of 50 mm or more. As a result of subjecting the ingot or billet to hot forging and recrystallization annealing, the cast structure is destroyed and uniform and fine (100 µm or less) crystal grains as a whole can be obtained.

Meanwhile, if sputtering is to be performed using a target produced as described above, it is said that the recrystallized structure of the target becomes even finer and more uniform, more uniform deposition is possible with a target in which the crystal orientation is aligned toward a specific direction, and a film with low generation of arcing and particles and stable characteristics can be obtained.

Thus, measures are being taken for achieving a finer and more uniform recrystallized structure and aligning the crystal orientation toward a specific direction in the production process of the target (for example, refer to Patent Document 1 and Patent Document 2).

Moreover, disclosed is a high purity Ta target for forming a TaN film to be used as a barrier layer in a Cu wiring film which is obtained by containing 0.001 to 20 ppm of an element selected among Ag, Au and Cu as an element having self-sustained discharge characteristics, causing the total amount of Fe, Ni, Cr, Si, Al, Na, and K as impurity elements to be 100 ppm or less, and using a high purity Ta in which the value obtained by subtracting such impurity elements is within the range of 99.99 to 99.999% (refer to Patent Document 3).

When reviewing these Patent Documents, there is no disclosure to the effect of the inclusion of a specific element realizing a finer structure and thereby stabilizing the plasma.

Particularly, Patent Document 3 increases the discharge amount of Ta ions by adding an infinitesimal amount of an element up to 0.001 ppm as a result of containing an element selected among Ag, Au and Cu in an amount of 0.001 to 20 ppm. However, since the additive element is a trace amount, it is considered that there is a problem of difficulty in adjusting the content and in adding evenly (variation).

As shown in Table 1 of Patent Document 3, the inclusion of amounts of Mo, W, Ge, and Co is respectively tolerable at less than 10 ppm, 20 ppm, 10 ppm, and 10 ppm. This alone adds up to impurities in an amount that is less than 50 ppm.

Accordingly, as described above, although Patent Document 3 describes "causing the total amount of Fe, Ni, Cr, Si, Al, Na, and K as impurity elements to be 100 ppm or less, and using a high purity Ta in which the value obtained by subtracting such impurity elements is within the range of 99.99 to 99.999%," the lower limit of the actual purity falls below (tolerates) 99.99%.

This is a level that is lower than conventional high purity tantalum, and it is strongly assumed that the characteristics of high purity tantalum cannot be utilized.

[Patent Document 1] Published Japanese Translation of WO2002-518593
[Patent Document 2] U.S. Pat. No. 6,331,233
[Patent Document 3] Japanese Published Unexamined Patent Application No. 2002-60934

SUMMARY OF THE INVENTION

An object of the present invention is to provide a high purity tantalum sputtering target comprising a uniform and fine structure and which yields stable plasma and superior film evenness (uniformity) by maintaining the high purity of tantalum and adding a specific element.

In order to achieve the foregoing object, the present inventors discovered that it is possible to obtain a high purity tantalum sputtering target comprising a uniform and fine structure and which yields stable plasma and superior film evenness (uniformity) by maintaining the high purity of tantalum and adding a specific element.

Based on the foregoing discovery, the present invention provides:
1) A tantalum sputtering target containing 1 mass ppm or more and 100 mass ppm or less of tungsten as an essential component, and having a purity of 99.998% or more excluding tungsten and gas components;
2) A tantalum sputtering target containing 10 mass ppm or more and 100 mass ppm or less of tungsten as an essential component, and having a purity of 99.998% or more excluding tungsten and gas components;
3) A tantalum sputtering target containing 10 mass ppm or more and 50 mass ppm or less of tungsten as an essential component, and having a purity of 99.998% or more excluding tungsten and gas components;
4) The tantalum sputtering target according to any one of 1) to 3) above, wherein variation of the tungsten content in the target is ±20% or less;
5) The tantalum sputtering target according to any one of 1) to 4) above, wherein an average crystal grain size is 120 µm or less; and
6) The tantalum sputtering target according to 5) above, wherein variation of the crystal grain size is ±20% or less.

The present invention additionally provides:
7) The tantalum sputtering target according to 1) above, further containing 0 to 100 mass ppm, excluding 0 mass ppm, of molybdenum and/or niobium, wherein the total content of tungsten, molybdenum and niobium is 1 mass ppm or more and 150 mass ppm or less, and wherein the purity excluding tungsten, molybdenum, niobium and gas components is 99.998% or more;

8) The tantalum sputtering target according to 7) above, further containing 10 mass ppm or more and 100 mass ppm or less of molybdenum and/or niobium;

9) The tantalum sputtering target according to 7) above, further containing 10 mass ppm or more and 50 mass ppm or less of molybdenum and/or niobium;

10) The tantalum sputtering target according to any one of 7) to 9) above, wherein variation of content of tungsten, molybdenum and niobium in the target is ±20% or less;

11) The tantalum sputtering target according to any one of 7) to 10) above, wherein an average crystal grain size is 120 µm or less; and 12) The tantalum sputtering target according to 11) above, wherein variation of the crystal grain size is ±20% or less.

The present invention yields a superior effect of being able to provide a high purity tantalum sputtering target comprising a uniform and fine structure and which yields stable plasma and superior film evenness (uniformity) by maintaining the high purity of tantalum and adding tungsten as an essential component, and further adding molybdenum and/or niobium as needed. Since the plasma stabilization during sputtering can also be realized in the initial stage of sputtering, the present invention additionally yields the effect of being able to shorten the burn-in time.

DETAILED DESCRIPTION OF THE INVENTION

High purity tantalum is used as the raw material of the tantalum (Ta) target used in the present invention. An example of this high purity tantalum is shown in Table 1 (refer to the journal of technical disclosure 2005-502770 entitled "High Purity Tantalum and Sputtering Target made of High Purity Tantalum" edited by the Japan Institute of Invention and Innovation).

In Table 1, the total amount of impurities excluding gas components is less than 1 mass ppm; that is, 99.999 to 99.9999 mass %, and this kind of high purity tantalum can be used.

TABLE 1

(Analytical Value)

| Element | Concentration [ppm wt] |
|---|---|
| Li | <0.001 |
| Be | <0.001 |
| B | <0.005 |
| F | <0.05 |
| Na | <0.005 |
| Mg | <0.005 |
| Al | <0.005 |
| Si | <0.001 |
| P | <0.005 |
| S | <0.005 |
| Cl | <0.01 |
| K | <0.01 |
| Ca | <0.01 |
| Sc | <0.001 |
| Ti | <0.001 |
| V | <0.001 |
| Cr | <0.001 |
| Mn | <0.001 |
| Fe | <0.005 |
| Co | <0.001 |
| Ni | <0.005 |
| Cu | <0.01-0.20 |
| Zn | <0.01 |
| Ga | <0.01 |
| Ge | <0.01 |
| As | <0.005 |
| Se | <0.01 |
| Br | <0.01 |
| Rb | <0.005 |
| Sr | <0.005 |
| Y | <0.001 |
| Zr | <0.01 |
| Nb | 0.1-0.46 |
| Mo | 0.05-0.20 |
| Ru | <0.01 |
| Rh | <0.005 |
| Pd | <0.005 |
| Ag | <0.005 |
| Cd | <0.01 |
| In | <0.005 |
| Sn | <0.05 |
| Sb | <0.01 |
| Te | <0.01 |
| I | <0.01 |
| Cs | <0.005 |
| Ba | <0.005 |
| La | <0.005 |
| Ce | <0.005 |
| Pr | <0.005 |
| Nd | <0.005 |
| Sm | <0.005 |
| Eu | <0.005 |
| Gd | <0.005 |
| Tb | <0.005 |
| Dy | <0.005 |
| Ho | <0.005 |
| Er | <0.005 |
| Tm | <0.005 |
| Yb | <0.005 |
| Lu | <0.005 |
| Hf | <0.01 |
| Ta | Matrix |
| W | <0.05-0.27 |
| Re | <0.01 |
| Os | <0.005 |
| Ir | <0.01 |
| Pt | <0.05 |
| Au | <0.1 |
| Hg | <0.05 |
| Tl | <0.005 |
| Pb | <0.005 |
| Bi | <0.005 |
| Th | <0.0001 |
| U | <0.0001 |

The sputtering target of the present invention is produced with the following process under normal circumstances.

To exemplify a specific example, foremost, tantalum; for instance, high purity tantalum of 4N (99.99% or more) is used, and appropriate amount of tungsten (W) is added to prepare a target raw material. And, molybdenum and/or niobium may be further added to prepare a target raw material. The purity thereof is increased by melting and refining the target raw material via electron beam melting or the like, and this is case to prepare an ingot or a billet. Needless to say, the high purity tantalum of 99.999 to 99.9999 mass % shown in Table 1 may be used from the start.

Subsequently, this ingot or billet is subject to a series of processing steps of annealing-forging, rolling, annealing (heat treatment), finish processing and the like.

Specifically, for instance, the foregoing ingot is subject to—extend forging—(first) annealing at a temperature from 1373 K to 1673 K—(first) cold forging—(second) recrystallization annealing from a starting temperature of recrystallization to 1373 K—(second) cold forging—(third) recrystallization annealing from a starting temperature of recrystallization to 1373 K—(first) cold (hot) rolling—(fourth) recrystallization annealing from a starting temperature of recrystallization to 1373 K—(as needed, second) cold (hot) rolling—(as needed, fifth) recrystallization annealing from a starting temperature of recrystallization to 1373 K—finish processing to obtain a target material.

The forging or rolling performed to the ingot or billet will destroy the cast structure, disperse or eliminate the pores and segregations, and, by further annealing this, recrystallization will occur, and the densification and strength of the structure can be improved to a certain degree by repeating the foregoing cold forging or cold rolling and recrystallization annealing. Although the recrystallization annealing may only be performed once in the foregoing processing process, the structural defects can be reduced as much as possible by repeating such recrystallization annealing twice. Moreover, the cold (hot) rolling and recrystallization annealing performed from a starting temperature of recrystallization to 1373 K may be performed for only once or more cycles. The final target shape is obtained by subsequently performing finish processing such as machining and polishing.

The tantalum target is produced based on the foregoing production process under normal circumstances, but this production method is merely an exemplification, and the present invention is not an invention of the production process. Accordingly, the target can be produced based on other processes, and this invention covers all of these targets. A material having a purity level of 6N is often used to leverage the characteristics of the tantalum target, but there was always a problem in that the crystal grains of the target would easily become coarse. The present inventors discovered that, in the production of this kind of 6N level target, the crystal grain size was locally fine at the portion where tungsten of a content of approximately 0.5 mass ppm under normal circumstances had segregated at approximately 1 mass ppm by chance. Accordingly, as a result of obtaining the hint that the addition of tungsten may be effective for achieving a finer crystalline structure of a tantalum target, the present inventors found the opportunity that led to this invention. Moreover, during the foregoing examination, as a result of conducting numerous experiments on materials that are of the same nature as tungsten or materials that can be added together with tungsten, the present inventors discovered that molybdenum and niobium are effective.

Specifically, what is important with the tantalum sputtering target of this invention is that 1 mass ppm or more and 100 mass ppm or less of tungsten is contained as an essential component in tantalum having a purity of 99.998% or more excluding tungsten and gas components. If needed, 0 to 100 mass ppm in total of molybdenum and/or niobium may further be added, wherein the range of the addition amount excludes 0 mass ppm. 1 mass ppm as the lower limit of tungsten is a numerical value for exhibiting the foregoing effect, and 100 mass ppm as the upper limit of tungsten is the upper limit for maintaining the effect of the present invention. The upper limit of tungsten is set to 100 mass ppm: because when tungsten exceeds the limit, segregation of molybdenum will occur, a part of tungsten in which the recrystallization is incomplete will arise, and the burn-in time will consequently be prolonged. Based on the foregoing discovery concerning tungsten, the present inventors examined whether there are any other additive materials of the same quality, and discovered the additive materials which yield similar effects are molybdenum and niobium. Hereinafter, a case of adding tungsten alone or tungsten together with molybdenum and/or niobium will be explained.

The addition of tungsten alone or tungsten together with molybdenum and/or niobium forms a uniform and fine structure of the target, thereby stabilizes the plasma, and improves the evenness (uniformity) of the sputtered film. Moreover, since the plasma stabilization during sputtering can also be realized in the initial stage of sputtering, the burn-in time can be shortened. In the foregoing case, the purity of tantalum needs to be high purity; that is, 99.998% or more. Here, gas components with a small atomic radius such as oxygen, hydrogen, carbon, nitrogen can be excluded. Generally, it is difficult to exclude gas components unless a special method is employed, and they are difficult to eliminate during the refining in the production process under normal circumstances. Thus, gas components are excluded from the purity of tantalum of the present invention.

Since molybdenum and niobium play a part (has a function) that is equivalent to the addition of tungsten, they can be added together. Although there is no particular limitation in the lower limit of adding molybdenum and niobium, the upper limit is set to 100 mass ppm. If this upper limited is exceeded, as with tungsten, segregation of molybdenum and/or niobium tends to occur, and, therefore, the upper limit is set to 100 mass ppm. Accordingly, the co-addition of tungsten and molybdenum and/or niobium should result in the total amount of tungsten and molybdenum and/or niobium being 1 mass ppm or more and 150 mass ppm or less.

This is because, outside the foregoing range, unrecrystallized portions arise and variation of the crystal grain size increases as shown in the Comparative Examples described later, and, in addition, the resistivity distribution within the sheet and the electric energy until the initial stabilization tend to increase. Consequently, the uniformity of the film also becomes inferior. This tendency is the same as the case of adding large amounts of tungsten (independent addition) which exceed the amount prescribed in this invention. Nevertheless, an effect of the co-addition is that the foregoing problems do not occur if the total amount of tungsten and molybdenum and/or niobium is 150 mass ppm or less. Although the reason for this is not necessarily clear, it is considered to be because, although tungsten, molybdenum and niobium respectively have similarities, they are respectively different substances, and the problem of segregation and effect on crystallization arise as their respective problems. Nevertheless, this co-addition also has its limits, and the results showed that any addition in which the total amount of tungsten and molybdenum and/or niobium exceeds 150 mass ppm is undesirable.

As described above, the addition of tungsten alone or tungsten together with molybdenum and/or niobium makes it possible to form a uniform and fine structure in tantalum, but the existence of other metal elements, non-metallic substances comprising metal elements, oxides, nitrides, carbides, or other ceramics is harmful and impermissible. The harmful elements or substances listed above are considered to inhibit the effect of adding tungsten, molybdenum and niobium. In addition, these impurities are clearly different from tungsten, molybdenum and niobium, and it is difficult to achieve a uniform crystal grain size of the tantalum target, and it does not contribute to the stabilization of the sputtering characteristics.

The tantalum sputtering target of the present invention contains, as a more preferable range, 10 mass ppm or more and 100 mass ppm or less of tungsten as an essential component, and has a purity of 99.999% or more excluding tungsten and gas components.

Moreover, the tantalum sputtering target of the present invention contains 10 mass ppm or more and 50 mass ppm or less of tungsten as an essential component, and has a purity of 99.999% or more excluding tungsten and gas components.

When co-doping tungsten and molybdenum and/or niobium, it is desirable to adjust the total amount of these components as with the foregoing tungsten upon adding the same.

With the tantalum sputtering target of the present invention, preferably, variation of the tungsten content in the target is ±20% or less. The same applies upon co-doping tungsten and molybdenum and/or niobium.

So as long as the inclusion of an appropriate amount of tungsten yields the function (property) of forming the uniform and fine structure of the tantalum sputtering target, the uniform dispersion of tungsten will contribute even more to the uniform and fine structure of the target. The same effect can be yielded in cases of co-doping tungsten and molybdenum and/or niobium.

Needless to say, it is easy to achieve the above with a standard production process, but it is necessary to take note of causing the variation of the tungsten content in the target to be ±20% or less, and to have a clear intent to achieve the same. The same applies upon co-doping tungsten and molybdenum and/or niobium.

The variation of the content of tungsten, molybdenum and/or niobium in the target is measured; for example, in the case of a discoid target, by taking three points (center point, ½ point of the radius, and point in the outer periphery or its vicinity) on eight equal lines passing through the center of the disk, and analyzing the content of tungsten, molybdenum and/or niobium at a total of 17 points {16 points+center point (since the center point is common, and counted as one point)}.

Subsequently, the variation is calculated at the respective points based on the formula of {(maximum value−minimum value)/(maximum value+minimum value)}×100.

With the tantalum sputtering target of the present invention, more preferably, the average crystal grain size is 120 μm or less. The crystal grain size can be refined by the addition of an appropriate amount of tungsten and a normal production process, but it is necessary to take note of causing the average crystal grain size to be 120 μm or less, and to have a clear intent to achieve the same.

More preferably, the variation of the crystal grain size is ±20% or less. The same applies upon co-doping tungsten and molybdenum and/or niobium.

The variation of the average crystal grain size in the tantalum target is measured; for example, in the case of a discoid target, by taking three points (center point, ½ point of the radius, and point in the outer periphery or its vicinity) on eight equal lines passing through the center of the disk, and measuring the crystal grain size of tantalum at a total of 17 points {16 points+center point (since the center point is counted as one point)}.

The variation of the crystal grain size is calculated at the respective points based on this formula:

{(maximum value−minimum value)/(maximum value+minimum value)}×100.

This kind of target structure enables stable plasma and yields superior evenness (uniformity) of the film. Moreover, since the plasma stabilization during sputtering can also be realized in the initial stage of sputtering, the present invention additionally yields the effect of being able to shorten the burn-in time.

EXAMPLES

The present invention is now explained in detail with reference to the Examples. These Examples are merely illustrative, and the present invention shall in no way be limited thereby. In other words, the present invention covers the other modes and modifications included in the technical concept of this invention.

Example 1

A raw material obtained by adding tungsten in an amount corresponding to 1 mass ppm to tantalum having a purity of 99.998% was subject to electron beam melting, and this was cast to prepare an ingot having a thickness of 200 mm and diameter of 200 mmϕ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1480 K. As a result of repeating forging and heat treatment again, a material having a thickness 120 mm and a diameter 130 mmϕ, and a structure in which the average crystal grain size is 150 μm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 120 μm, and the variation of the crystal grain size was ±20%. Moreover, the variation of the tungsten content was ±20%. The results are shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 2, evidently, the fluctuation of the resistance distribution in the sheet is small (2.6 to 3.2%) from the initial stage to the end stage of sputtering in this Example; that is, the fluctuation of the film thickness distribution is small.

The electrical energy required up to the initial stabilization of sputtering was also measured and showed 120 kWh, and decreased, as the results shown in Table 2. Thus, besides shortening the burn-in time, the evenness (uniformity) of the film was favorable, and it was possible to improve the quality of the sputter deposition.

TABLE 2

| | W | Average Crystal Grain Size | Variation in Crystal Grain Size | Variation in W Content | Resistivity Distribution in Sheet | Electrical Energy up to initial Stabilization | Uniformity of Film |
|---|---|---|---|---|---|---|---|
| Example 1 | 1 | 120 | ±20% | ±20% | 2.6 ~ 3.2% | 120 kwh | Favorable |
| Example 2 | 5 | 110 | ±17% | ±18% | 2.5 ~ 3.0% | 100 kwh | Favorable |
| Example 3 | 10 | 90 | ±15% | ±16% | 2.3 ~ 2.7% | 90 kwh | Favorable |
| Example 4 | 20 | 85 | ±10% | ±12% | 2.0 ~ 2.2% | 87 kwh | Favorable |
| Example 5 | 50 | 80 | ±8% | ±10% | 1.7 ~ 1.9% | 85 kwh | Favorable |
| Example 6 | 70 | 75 | ±7% | ±8% | 1.3 ~ 1.5% | 82 kwh | Favorable |
| Example 7 | 100 | 70 | ±5% | ±6% | 1.0 ~ 1.2% | 80 kwh | Favorable |
| Comparative Example 1 | 0.5 | 130 | ±35% | ±40% | 3.8 ~ 6.0% | 200 kwh | Inferior |
| Comparative Example 2 | 150 | 80 Variation caused by Segregation | ±50% | ±70% | 4.5 ~ 7.0% | 130 kwh | Inferior |

Example 2

A raw material obtained by adding tungsten in an amount corresponding to 5 mass ppm to tantalum having a purity of 99.999% was subject to electron beam melting, and this was cast to prepare an ingot having a thickness of 200 mm and diameter of 200 mmφ. The crystal grain size in this case was approximately 50 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmφ. Cold working and recrystallization annealing in the middle and last were adjusted to achieve the following average crystal grain size and variation thereof. Although the average crystal grain size and variation will also change depending on the additive amount of tungsten, the foregoing adjustment 1.5 was possible in this Example.

The average crystal grain size of the target was 110 μm, and the variation thereof was ±17%. Moreover, the variation of the tungsten content was ±18%. The results are similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 2, evidently, the fluctuation of the resistance distribution in the sheet is small (2.5 to 3.0%) from the initial stage to the end stage of sputtering in this Example; that is, the fluctuation of the film thickness distribution is small.

The electrical energy required up to the initial stabilization of sputtering was also measured and showed 100 kWh, and decreased, as the results shown in Table 2. Thus, besides shortening the burn-in time, the evenness (uniformity) of the film was favorable, and it was possible to improve the quality of the sputter deposition.

Example 3

A raw material obtained by adding tungsten in an amount corresponding to 10 mass ppm to tantalum having a purity of 99.999% was subject to electron beam melting, and this was cast to prepare an ingot having a thickness of 200 mm and diameter of 200 mmφ. The crystal grain size in this case was approximately 45 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmφ. Cold working and recrystallization annealing in the middle and last were adjusted to achieve the following average crystal grain size and variation thereof. Although the average crystal grain size and variation will also change depending on the additive amount of tungsten, the foregoing adjustment was possible in this Example.

The average crystal grain size of the target was 90 μm, and the variation thereof was ±15%. Moreover, the variation of the tungsten content was ±16%. The results are similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 2, evidently, the fluctuation of the resistance distribution in the sheet is small (2.3 to 2.7%) from the initial stage to the end stage of sputtering in this Example; that is, the fluctuation of the film thickness distribution is small.

The electrical energy required up to the initial stabilization of sputtering was also measured and showed 90 kWh, and decreased, as the results shown in Table 2. Thus, besides shortening the burn-in time, the evenness (uniformity) of the film was favorable, and it was possible to improve the quality of the sputter deposition.

Example 4

A raw material obtained by adding tungsten in an amount corresponding to 20 mass ppm to tantalum having a purity of 99.999% was subject to electron beam melting, and this was cast to prepare an ingot having a thickness of 200 mm and diameter of 200 mmϕ. The crystal grain size in this case was approximately 40 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmϕ. Cold working and recrystallization annealing in the middle and last were adjusted to achieve the following average crystal grain size and variation thereof. Although the average crystal grain size and variation will also change depending on the additive amount of tungsten, the foregoing adjustment was possible in this Example.

The average crystal grain size of the target was 85 μm, and the variation thereof was ±10%. Moreover, the variation of the tungsten content was ±12%. The results are similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 2, evidently, the fluctuation of the resistance distribution in the sheet is small (2.0 to 2.2%) from the initial stage to the end stage of sputtering in this Example; that is, the fluctuation of the film thickness distribution is small.

The electrical energy required up to the initial stabilization of sputtering was also measured and showed 87 kWh, and decreased, as the results shown in Table 2. Thus, besides shortening the burn-in time, the evenness (uniformity) of the film was favorable, and it was possible to improve the quality of the sputter deposition.

Example 5

A raw material obtained by adding tungsten in an amount corresponding to 50 mass ppm to tantalum having a purity of 99.999% was subject to electron beam melting, and this was cast to prepare an ingot having a thickness of 200 mm and diameter of 200 mmϕ. The crystal grain size in this case was approximately 35 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmϕ. Cold working and recrystallization annealing in the middle and last were adjusted to achieve the following average crystal grain size and variation thereof. Although the average crystal grain size and variation will also change depending on the additive amount of tungsten, the foregoing adjustment was possible in this Example.

The average crystal grain size of the target was 80 μm, and the variation thereof was ±8%. Moreover, the variation of the tungsten content was ±10%. The results are similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 2, evidently, the fluctuation of the resistance distribution in the sheet is small (1.7 to 1.9%) from the initial stage to the end stage of sputtering in this Example; that is, the fluctuation of the film thickness distribution is small.

The electrical energy required up to the initial stabilization of sputtering was also measured and showed 85 kWh, and decreased, as the results shown in Table 2. Thus, besides shortening the burn-in time, the evenness (uniformity) of the film was favorable, and it was possible to improve the quality of the sputter deposition.

Example 6

A raw material obtained by adding tungsten in an amount corresponding to 70 mass ppm to tantalum having a purity of 99.999% was subject to electron beam melting, and this was cast to prepare an ingot having a thickness of 200 mm and diameter of 200 mmϕ. The crystal grain size in this case was approximately 30 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmφ. Cold working and recrystallization annealing in the middle and last were adjusted to achieve the following average crystal grain size and variation thereof. Although the average crystal grain size and variation will also change depending on the additive amount of tungsten, the foregoing adjustment was possible in this Example.

The average crystal grain size of the target was 75 µm, and the variation thereof was ±7%. Moreover, the variation of the tungsten content was ±8%. The results are similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation ($\pi$) thereof.

As the results shown in Table 2, evidently, the fluctuation of the resistance distribution in the sheet is small (1.3 to 1.5%) from the initial stage to the end stage of sputtering in this Example; that is, the fluctuation of the film thickness distribution is small.

The electrical energy required up to the initial stabilization of sputtering was also measured and showed 82 kWh, and decreased, as the results shown in Table 2. Thus, besides shortening the burn-in time, the evenness (uniformity) of the film was favorable, and it was possible to improve the quality of the sputter deposition.

Example 7

A raw material obtained by adding tungsten in an amount corresponding to 100 mass ppm to tantalum having a purity of 99.999% was subject to electron beam melting, and this was cast to prepare an ingot having a thickness of 200 mm and diameter of 200 mmφ. The crystal grain size in this case was approximately 25 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 100 µm was obtained.

Subsequently, this was subject to cold rolling and recrystallization annealing, and finish processing so as to obtain a target material having a thickness of 10 mm and a diameter of 450 mmφ. Cold working and recrystallization annealing in the middle and last were adjusted to achieve the following average crystal grain size and variation thereof. Although the average crystal grain size and variation will also change depending on the additive amount of tungsten, the foregoing adjustment was possible in this Example.

The average crystal grain size of the target was 70 µm, and the variation thereof was ±5%. The variation of the tungsten content was ±6%, as the results shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation ($\pi$) thereof.

As the results shown in Table 2, evidently, the fluctuation of the resistance distribution in the sheet is small (1.0 to 1.2%) from the initial stage to the end stage of sputtering in this Example; that is, the fluctuation of the film thickness distribution is small.

The electrical energy required up to the initial stabilization of sputtering was also measured and showed 80 kWh, and decreased, as the results shown in Table 2. Thus, besides shortening the burn-in time, the evenness (uniformity) of the film was favorable, and it was possible to improve the quality of the sputter deposition.

Comparative Example 1

A raw material obtained by adding tungsten in an amount corresponding to 0.5 mass ppm to tantalum having a purity of 99.995% was subject to electron beam melting, and this was cast to prepare an ingot having a thickness of 200 mm and diameter of 200 mmφ. The crystal grain size in this case was approximately 60 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 100 µm was obtained.

Subsequently, this was subject to cold rolling and recrystallization annealing, and finish processing so as to obtain a target material having a thickness of 10 mm and a diameter of 450 mmφ. Cold working and recrystallization annealing in the middle and last were adjusted to achieve the following average crystal grain size and variation thereof, but the foregoing adjustment was not possible in this Comparative Example, and the average crystal grain size of the target was 130 µm, and variation thereof was ±35%. And, variation of the tungsten content was ±40%. The results are similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation ($\pi$) thereof.

As the results shown in Table 2, evidently, the fluctuation of the resistance distribution in the sheet is large (3.8 to 6.0%) from the initial stage to the end stage of sputtering in this Comparative Example; that is, the fluctuation of the film thickness distribution is large.

The electrical energy required up to the initial stabilization of sputtering was also measured and showed 200 kWh, and increased, as the results also shown in Table 2. Thus, it was not possible to shorten the burn-in time, the evenness (uniformity) of the film was inferior, and it was not possible to improve the quality of the sputter deposition.

Similar testing was performed for a case of adding tungsten in an amount corresponding to 0.5 mass ppm to tantalum having a purity of purity of 99.999%, but the same tendency as this Comparative Example 1 was observed. It was obvious that this also affected the purity of tantalum.

Comparative Example 2

A raw material obtained by adding tungsten in an amount corresponding to 150 mass ppm to tantalum having a purity of 99.999% was subject to electron beam melting, and this was cast to prepare an ingot having a thickness of 200 mm and diameter of 200 mmϕ. The crystal grain size in this case was approximately 20 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmϕ. Cold working and recrystallization annealing in the middle and last were adjusted to achieve the following average crystal grain size and variation thereof, but the foregoing adjustment was not possible in this Comparative Example, and the average crystal grain size of the target was supposedly 80 μm, but the variation thereof was ±50%, and variation caused by segregation was considerable. And, variation of the tungsten content was ±70%, as the results similarly shown in Table 2.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 2, evidently, the fluctuation of the resistance distribution in the sheet is large (4.5 to 7.0%) from the initial stage to the end stage of sputtering in this Comparative Example; that is, the fluctuation of the film thickness distribution is large.

The electrical energy required up to the initial stabilization of sputtering was also measured and showed 130 kWh, and increased, as the results also shown in Table 2. Thus, it was not possible to shorten the burn-in time, the evenness (uniformity) of the film was inferior, and it was not possible to improve the quality of the sputter deposition.

Example 8

A raw material obtained by adding 2.2 mass ppm of tungsten, 32 mass ppm of molybdenum and 12 mass ppm of niobium in a total additive amount of 46.2 mass ppm to tantalum having a purity of 99.998% was subject to electron beam melting, and this was cast to prepare an ingot having a thickness of 200 mm and diameter of 200 mmϕ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 130 μm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 85 μm, and the variation of the crystal grain size was ±11%. Moreover, variation of the content of tungsten, molybdenum and niobium was within ±6%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (2.0 to 2.5%) from the initial stage to the end stage of sputtering in this Example; that is, the fluctuation of the film thickness distribution is small.

The electrical energy required up to the initial stabilization of sputtering was also measured and showed 55 kWh, and decreased, as the results shown in Table 3. Thus, besides shortening the burn-in time, the evenness (uniformity) of the film was favorable, and it was possible to improve the quality of the sputter deposition.

TABLE 3

| Examples | W | Mo | Nb | Content of W, Mo and Nb | Average Crystal Grain Size | Variation in Crystal Grain Size | Variation in Content of Mo, Nb and W | Resistivity Distribution in Sheet | Electrical Energy up to Initial Stabilization | Uniformity of Film |
|---|---|---|---|---|---|---|---|---|---|---|
| Example 8 | 2.2 | 32 | 12 | 46.2 | 85 | ±11% | ±6% | 2.0 ~ 2.5% | 55 kwh | Favorable |
| Example 9 | 3.2 | 67 | 2.4 | 72.6 | 50 | ±7% | ±8% | 1.5 ~ 1.9% | 40 kwh | Favorable |
| Example 10 | 3.7 | 0.9 | 5.1 | 9.7 | 95 | ±18% | ±12% | 2.3 ~ 3.2% | 80 kwh | Favorable |
| Example 11 | 11 | — | 16 | 27 | 92 | ±13% | ±16% | 2.2 ~ 2.9% | 60 kwh | Favorable |
| Example 12 | 12 | 1.5 | 18 | 31.5 | 90 | ±14% | ±10% | 2.0 ~ 2.5% | 55 kwh | Favorable |
| Example 13 | 17 | — | 42 | 59 | 55 | ±7% | ±11% | 1.4 ~ 1.7% | 45 kwh | Favorable |
| Example 14 | 18 | 2.1 | 22 | 42.1 | 87 | ±12% | ±11% | 1.9 ~ 2.3% | 50 kwh | Favorable |
| Example 15 | 23 | 0.69 | 25 | 48.69 | 73 | ±8% | ±15% | 1.7 ~ 2.3% | 45 kwh | Favorable |
| Example 16 | 24 | 0.97 | 75 | 99.97 | 47 | ±5% | ±8% | 1.3 ~ 1.6% | 35 kwh | Favorable |
| Example 17 | 53 | 1.4 | — | 54.4 | 60 | ±10% | ±9% | 1.6 ~ 2.6% | 50 kwh | Favorable |

TABLE 3-continued

| Examples | W | Mo | Nb | Content of W, Mo and Nb | Average Crystal Grain Size | Variation in Crystal Grain Size | Variation in Content of Mo, Nb and W | Resistivity Distribution in Sheet | Electrical Energy up to Initial Stabilization | Uniformity of Film |
|---|---|---|---|---|---|---|---|---|---|---|
| Example 18 | 57 | 48 | 45 | 150 | 40 | ±7% | ±15% | 1.5 ~ 2.3 | 55 kwh | Favorable |
| Example 19 | 70 | 31.5 | 44.7 | 146.2 | 41 | ±8% | ±17% | 1.6 ~ 2.1 | 50 kwh | Favorable |
| Example 20 | 69.8 | 50 | 30 | 149.8 | 45 | ±6% | ±15% | 1.5 ~ 2.4 | 55 kwh | Favorable |
| Comparative Example 3 | 1.5 | 120 | 40 | 161.5 | 34 Unrecrystallized | ±60% | ±25% | 4.0 ~ 6.5% | 150 kwh | Inferior |
| Comparative Example 4 | 5.5 | 1.5 | 150 | 157 | 15 Unrecrystallized | ±50% | ±30% | 5.2 ~ 7.5% | 300 kwh | Inferior |
| Comparative Example 5 | 62.7 | 53.4 | 48.7 | 164.8 | 20 Unrecrystallized | ±50% | ±25% | 4.1 ~ 6.7% | 170 kwh | Inferior |

Example 9

A raw material obtained by adding 3.2 mass ppm of tungsten, 67 mass ppm of molybdenum and 2.4 mass ppm of niobium in a total additive amount of 72.6 mass ppm to tantalum having a purity of 99.998% was subject to electron beam melting, and this was cast to prepare an ingot having a thickness of 200 mm and diameter of 200 mmϕ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 130 μm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 50 μm, and the variation of the crystal grain size was ±7%. Moreover, variation of the content of tungsten, molybdenum and niobium was within ±8%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 3, evidently, the fluctuation of the resistance distribution in the sheet is small (1.5 to 1.9%) from the initial stage to the end stage of sputtering in this Example; that is, the fluctuation of the film thickness distribution is small.

The electrical energy required up to the initial stabilization of sputtering was also measured and showed 40 kWh, and decreased, as the results shown in Table 3. Thus, besides shortening the burn-in time, the evenness (uniformity) of the film was favorable, and it was possible to improve the quality of the sputter deposition.

Example 10

A raw material obtained by adding 3.7 mass ppm of tungsten, 0.9 mass ppm of molybdenum and 5.1 mass ppm of niobium in a total additive amount of 9.7 mass ppm to tantalum having a purity of 99.998% was subject to electron beam melting, and this was cast to prepare an ingot having a thickness of 200 mm and diameter of 200 mmϕ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 150 μm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 95 μm, and the variation of the crystal grain size was ±18%. Moreover, variation of the content of tungsten, molybdenum and niobium was within ±12%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (2.3 to 3.2%) from the initial stage to the end stage of sputtering in this Example; that is, the fluctuation of the film thickness distribution is small.

The electrical energy required up to the initial stabilization of sputtering was also measured and showed 80 kWh, and decreased, as the results shown in Table 3. Thus, besides shortening the burn-in time, the evenness (uniformity) of the film was favorable, and it was possible to improve the quality of the sputter deposition.

Example 11

A raw material obtained by adding 11 mass ppm of tungsten and 16 mass ppm of niobium (molybdenum was not added in this case) in a total additive amount of 27 mass ppm to tantalum having a purity of 99.998% was subject to electron beam melting, and this was cast to prepare an ingot having a thickness of 200 mm and diameter of 200 mmφ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 130 μm was obtained.

Subsequently, this was subject to cold rolling and recrystallization annealing at 1173 K, and finish processing so as to obtain a target material having a thickness of 10 mm and a diameter of 450 mmφ.

The average crystal grain size of the target was 92 μm, and the variation of the crystal grain size was ±13%. Moreover, variation of the content of tungsten and niobium was within ±16%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (2.2 to 2.9%) from the initial stage to the end stage of sputtering in this Example; that is, the fluctuation of the film thickness distribution is small.

The electrical energy required up to the initial stabilization of sputtering was also measured and showed 60 kWh, and decreased, as the results shown in Table 3. Thus, besides shortening the burn-in time, the evenness (uniformity) of the film was favorable, and it was possible to improve the quality of the sputter deposition.

Example 12

A raw material obtained by adding 12 mass ppm of tungsten, 1.5 mass ppm of molybdenum and 18 mass ppm of niobium in a total additive amount of 31.5 mass ppm to tantalum having a purity of 99.998% was subject to electron beam melting, and this was cast to prepare an ingot having a thickness of 200 mm and diameter of 200 mmφ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 130 μm was obtained.

Subsequently, this was subject to cold rolling and recrystallization annealing at 1173 K, and finish processing so as to obtain a target material having a thickness of 10 mm and a diameter of 450 mmφ.

The average crystal grain size of the target was 90 μm, and the variation of the crystal grain size was ±14%. Moreover, variation of the content of tungsten, molybdenum and niobium was within ±10%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (2.0 to 2.5%) from the initial stage to the end stage of sputtering in this Example; that is, the fluctuation of the film thickness distribution is small.

The electrical energy required up to the initial stabilization of sputtering was also measured and showed 55 kWh, and decreased, as the results shown in Table 3. Thus, besides shortening the burn-in time, the evenness (uniformity) of the film was favorable, and it was possible to improve the quality of the sputter deposition.

Example 13

A raw material obtained by adding 17 mass ppm of tungsten and 42 mass ppm of niobium (molybdenum was not added in this case) in a total additive amount of 59 mass ppm to tantalum having a purity of 99.998% was subject to electron beam melting, and this was cast to prepare an ingot having a thickness of 200 mm and diameter of 200 mmφ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 130 μm was obtained.

Subsequently, this was subject to cold rolling and recrystallization annealing at 1173 K, and finish processing so as to obtain a target material having a thickness of 10 mm and a diameter of 450 mmφ.

The average crystal grain size of the target was 55 μm, and the variation of the crystal grain size was ±7%. Moreover, variation of the content of tungsten and niobium was within ±11%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (1.4 to 1.7%) from the initial stage to the end stage of sputtering in this Example; that is, the fluctuation of the film thickness distribution is small.

The electrical energy required up to the initial stabilization of sputtering was also measured and showed 45 kWh, and decreased, as the results shown in Table 3. Thus, besides shortening the burn-in time, the evenness (uniformity) of the film was favorable, and it was possible to improve the quality of the sputter deposition.

Example 14

A raw material obtained by adding 18 mass ppm of tungsten, 2.1 mass ppm of molybdenum and 22 mass ppm of niobium in a total additive amount of 42.1 mass ppm to tantalum having a purity of 99.998% was subject to electron beam melting, and this was cast to prepare an ingot having a thickness of 200 mm and diameter of 200 mmϕ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 130 µm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 87 µm, and the variation of the crystal grain size was ±12%. Moreover, variation of the content of tungsten, molybdenum and niobium was within ±11%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (1.9 to 2.3%) from the initial stage to the end stage of sputtering in this Example; that is, the fluctuation of the film thickness distribution is small.

The electrical energy required up to the initial stabilization of sputtering was also measured and showed 50 kWh, and decreased, as the results shown in Table 3. Thus, besides shortening the burn-in time, the evenness (uniformity) of the film was favorable, and it was possible to improve the quality of the sputter deposition.

Example 15

A raw material obtained by adding 23 mass ppm of tungsten, 0.69 mass ppm of molybdenum and 25 mass ppm of niobium in a total additive amount of 48.69 mass ppm to tantalum having a purity of 99.998% was subject to electron beam melting, and this was cast to prepare an ingot having a thickness of 200 mm and diameter of 200 mmϕ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 130 µm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 73 µm, and the variation of the crystal grain size was ±8%. Moreover, variation of the content of tungsten, molybdenum and niobium was within ±15%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (1.7 to 2.3%) from the initial stage to the end stage of sputtering in this Example; that is, the fluctuation of the film thickness distribution is small.

The electrical energy required up to the initial stabilization of sputtering was also measured and showed 45 kWh, and decreased, as the results shown in Table 3. Thus, besides shortening the burn-in time, the evenness (uniformity) of the film was favorable, and it was possible to improve the quality of the sputter deposition.

Example 16

A raw material obtained by adding 24 mass ppm of tungsten, 0.97 mass ppm of molybdenum and 75 mass ppm of niobium in a total additive amount of 99.97 mass ppm to tantalum having a purity of 99.998% was subject to electron beam melting, and this was cast to prepare an ingot having a thickness of 200 mm and diameter of 200 mmϕ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 µm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 120 µm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 47 µm, and the variation of the crystal grain size was ±5%. Moreover, variation of the content of tungsten, molybdenum and niobium was within ±8%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 3, evidently, the fluctuation of the resistance distribution in the sheet is small (1.3 to 1.6%) from the initial stage to the end stage of sputtering in this Example; that is, the fluctuation of the film thickness distribution is small.

The electrical energy required up to the initial stabilization of sputtering was also measured and showed 35 kWh, and decreased, as the results shown in Table 3. Thus, besides shortening the burn-in time, the evenness (uniformity) of the film was favorable, and it was possible to improve the quality of the sputter deposition.

Example 17

A raw material obtained by adding 53 mass ppm of tungsten and 1.4 mass ppm of molybdenum (niobium was not added in this case) in a total additive amount of 54.4 mass ppm to tantalum having a purity of 99.998% was subject to electron beam melting, and this was cast to prepare an ingot having a thickness of 200 mm and diameter of 200 mmφ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 130 μm was obtained.

Subsequently, this was subject to cold rolling and recrystallization annealing at 1173 K, and finish processing so as to obtain a target material having a thickness of 10 mm and a diameter of 450 mmφ.

The average crystal grain size of the target was 60 μm, and the variation of the crystal grain size was ±10%. Moreover, variation of the content of tungsten and molybdenum was within ±9%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (1.6 to 2.6%) from the initial stage to the end stage of sputtering in this Example; that is, the fluctuation of the film thickness distribution is small.

The electrical energy required up to the initial stabilization of sputtering was also measured and showed 50 kWh, and decreased, as the results shown in Table 3. Thus, besides shortening the burn-in time, the evenness (uniformity) of the film was favorable, and it was possible to improve the quality of the sputter deposition.

Example 18

A raw material obtained by adding 57 mass ppm of tungsten, 48 mass ppm of molybdenum and 45 mass ppm of niobium in a total additive amount of 150 mass ppm to tantalum having a purity of 99.998% was subject to electron beam melting, and this was cast to prepare an ingot having a thickness of 200 mm and diameter of 200 mmφ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 100 μm was obtained.

Subsequently, this was subject to cold rolling and recrystallization annealing at 1173 K, and finish processing so as to obtain a target material having a thickness of 10 mm and a diameter of 450 mmφ.

The average crystal grain size of the target was 40 μm, and the variation of the crystal grain size was ±7%. Moreover, variation of the content of tungsten, molybdenum and niobium was within ±15%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 3, evidently, the fluctuation of the resistance distribution in the sheet is small (1.5 to 2.3%) from the initial stage to the end stage of sputtering in this Example; that is, the fluctuation of the film thickness distribution is small.

The electrical energy required up to the initial stabilization of sputtering was also measured and showed 55 kWh, and decreased, as the results shown in Table 3. Thus, besides shortening the burn-in time, the evenness (uniformity) of the film was favorable, and it was possible to improve the quality of the sputter deposition.

Example 19

A raw material obtained by adding 70 mass ppm of tungsten, 31.5 mass ppm of molybdenum and 44.7 mass ppm of niobium in a total additive amount of 146.2 mass ppm to tantalum having a purity of 99.998% was subject to electron beam melting, and this was cast to prepare an ingot having a thickness of 200 mm and diameter of 200 mmφ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 100 μm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 41 μm, and the variation of the crystal grain size was ±8%. Moreover, variation of the content of tungsten, molybdenum and niobium was within ±17%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (σ) thereof.

As the results shown in Table 3, evidently, the fluctuation of the resistance distribution in the sheet is small (1.6 to 2.1%) from the initial stage to the end stage of sputtering in this Example; that is, the fluctuation of the film thickness distribution is small.

The electrical energy required up to the initial stabilization of sputtering was also measured and showed 50 kWh, and decreased, as the results shown in Table 3. Thus, besides shortening the burn-in time, the evenness (uniformity) of the film was favorable, and it was possible to improve the quality of the sputter deposition.

Example 20

A raw material obtained by adding 69.8 mass ppm of tungsten, 50 mass ppm of molybdenum and 30 mass ppm of niobium in a total additive amount of 149.8 mass ppm to tantalum having a purity of 99.998% was subject to electron beam melting, and this was cast to prepare an ingot having a thickness of 200 mm and diameter of 200 mmϕ. The crystal grain size in this case was approximately 55 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmϕ, and a structure in which the average crystal grain size is 100 μm was obtained.

Subsequently, this was subject to cold rolling and recrystallization annealing at 1173 K, and finish processing so as to obtain a target material having a thickness of 10 mm and a diameter of 450 mmϕ.

The average crystal grain size of the target was 45 μm, and the variation of the crystal grain size was ±6%. Moreover, variation of the content of tungsten, molybdenum and niobium was within ±15%. The results are shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is small (1.5 to 2.4%) from the initial stage to the end stage of sputtering in this Example; that is, the fluctuation of the film thickness distribution is small.

The electrical energy required up to the initial stabilization of sputtering was also measured and showed 55 kWh, and decreased, as the results shown in Table 3. Thus, besides shortening the burn-in time, the evenness (uniformity) of the film was favorable, and it was possible to improve the quality of the sputter deposition.

Comparative Example 3

A raw material obtained by adding 1.5 mass ppm of tungsten, 120 mass ppm of molybdenum and 40 mass ppm of niobium in a total additive amount of 161.5 mass ppm to tantalum having a purity of 99.998% was subject to electron beam melting, and this was cast to prepare an ingot having a thickness of 200 mm and diameter of 200 mmϕ. The crystal grain size in this case was approximately 60 mm.

After performing extend forging to this ingot or billet at room temperature, this was subject to recrystallization annealing at a temperature of 1500 K. As a result, a material having a thickness of 120 mm and a diameter of 130 mmϕ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 20 mmϕ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmϕ. Cold working and recrystallization annealing in the middle and last were adjusted to achieve the following average crystal grain size and variation thereof, but the foregoing adjustment was not possible in this Comparative Example, and the average crystal grain size of the target was 34 μm (including unrecrystallized portions), and variation thereof was ±60%. And, variation of the content of tungsten, molybdenum and niobium was ±25%. The results are similarly shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is large (4.0 to 6.5%) from the initial stage to the end stage of sputtering in this Comparative Example; that is, the fluctuation of the film thickness distribution is large.

The electrical energy required up to the initial stabilization of sputtering was also measured and showed 150 kWh, and increased, as the results also shown in Table 3. Thus, it was not possible to shorten the burn-in time, the evenness (uniformity) of the film was inferior, and it was not possible to improve the quality of the sputter deposition.

Comparative Example 4

A raw material obtained by adding 5.5 mass ppm of tungsten, 1.5 mass ppm of molybdenum and 150 mass ppm of niobium in a total additive amount of 157 mass ppm to tantalum having a purity of 99.998% was subject to electron beam melting, and this was cast to prepare an ingot having a thickness of 200 mm and diameter of 200 mmφ. The crystal grain size in this case was approximately 20 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmφ. Cold working and recrystallization annealing in the middle and last were adjusted to achieve the following average crystal grain size and variation thereof, but the foregoing adjustment was not possible in this Comparative Example, and, although the average crystal grain size of the target was 15 μm, it included unrecrystallized portions, and variation of the crystal grain size was ±50%, and variation caused by segregation was considerable. And, variation of the content of tungsten, molybdenum and niobium was ±30%, as the results shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is large (5.2 to 7.5%) from the initial stage to the end stage of sputtering in this Comparative Example; that is, the fluctuation of the film thickness distribution is large.

The electrical energy required up to the initial stabilization of sputtering was also measured and showed 300 kWh, and increased, as the results also shown in Table 3. Thus, it was not possible to shorten the burn-in time, the evenness (uniformity) of the film was inferior, and it was not possible to improve the quality of the sputter deposition.

Comparative Example 5

A raw material obtained by adding 62.7 mass ppm of tungsten, 53.4 mass ppm of molybdenum and 48.7 mass ppm of niobium in a total additive amount of 164.8 mass ppm to tantalum having a purity of 99.998% was subject to electron beam melting, and this was cast to prepare an ingot having a thickness of 200 mm and diameter of 200 mmφ. The crystal grain size in this case was approximately 20 mm.

After performing extend forging to this ingot or billet at room temperature, this was subject to recrystallization annealing at a temperature of 1500 K. As a result, a material having a thickness of 120 mm and a diameter of 130 mmφ, and a structure in which the average crystal grain size is 200 μm was obtained.

Subsequently, this was subject to extend forging and upset forging at room temperature once again, and recrystallization annealing was performed thereto again at a temperature of 1400 to 1500 K. As a result of repeating forging and heat treatment again, a material having a thickness 120 mm and a diameter 130 mmφ, and a structure in which the average crystal grain size is 100 μm was obtained.

Subsequently, this was subject to cold rolling and recrystallization annealing, and finish processing so as to obtain a target material having a thickness of 10 mm and a diameter of 450 mmφ. Cold working and recrystallization annealing in the middle and last were adjusted to achieve the following average crystal grain size and variation thereof, but the foregoing adjustment was not possible in this Comparative Example, and, although the average crystal grain size of the target was 20 μm, it included unrecrystallized portions, and variation of the crystal grain size was ±50%, and variation caused by segregation was considerable. And, variation of the content of tungsten, molybdenum and niobium was ±25%, as the results shown in Table 3.

Since the sheet resistance depends on the film thickness, the distribution of the sheet resistance in the wafer (12 inches) was measured to check the distribution condition of the film thickness. Specifically, the sheet resistance of 49 points on the wafer was measured to calculate the standard deviation (π) thereof.

As the results shown in Table 3, evidently, the fluctuation of the resistance distribution in the sheet is large (4.1 to 6.7%) from the initial stage to the end stage of sputtering in this Comparative Example; that is, the fluctuation of the film thickness distribution is large.

The electrical energy required up to the initial stabilization of sputtering was also measured and showed 170 kWh, and increased, as the results also shown in Table 3. Thus, it was not possible to shorten the burn-in time, the evenness (uniformity) of the film was inferior, and it was not possible to improve the quality of the sputter deposition.

When tungsten, molybdenum, and niobium were added to tantalum having a purity of 99.998% in a total additive amount exceeding 150 mass ppm, the crystal grain size suddenly coarsened and the variation increased, and variation of the content of tungsten, niobium, and molybdenum content also became prominent.

This is considered to be a result of the segregation of tungsten, molybdenum, and niobium, and it was discovered that the addition of excessive tungsten, molybdenum, and niobium is undesirable.

The present invention yields a superior effect of being able to provide a high purity tantalum sputtering target comprising a uniform and fine structure and which yields stable plasma and superior film evenness (uniformity) by containing 1 mass ppm or more and 100 mass ppm or less of tungsten as an essential component, and having a purity of 99.998% or more excluding tungsten and gas components. Moreover, since the plasma stabilization during sputtering can also be realized in the initial stage of sputtering, the present invention additionally yields the effect of being able to shorten the burn-in time. Thus, the target of the present invention is useful in the electronics field, particularly as a target suitable for forming films of complex shapes, forming circuits or forming barrier films.

The invention claimed is:

1. A tantalum sputtering target consisting of tungsten as an essential component of a content of 10 mass ppm or more and 100 mass ppm or less and a balance of tantalum and having a purity of 99.998 mass % or higher excluding tungsten and gas components.

2. A tantalum sputtering target according to claim 1, wherein the content of tungsten is 10 mass ppm or more and 50 mass ppm or less.

3. The tantalum sputtering target according to claim 2, wherein the content of tungsten has a variation within a range from −20% to +20% within the target.

4. The tantalum sputtering target according to claim 3, wherein the tantalum sputtering target has an average crystal grain size of 120 μm or less.

5. The tantalum sputtering target according to claim 4, wherein the average crystal grain size has a variation within a range from −20% to +20% within the target.

6. The tantalum sputtering target according to claim 1, wherein the content of tungsten has a variation within a range from −20% to +20% within the target.

7. The tantalum sputtering target according to claim 1, wherein the tantalum sputtering target has an average crystal grain size of 120 μm or less within the target.

8. The tantalum sputtering target according to claim 7, wherein the average crystal grain size has a variation within a range from −20% to +20% within the target.

9. A tantalum sputtering target according to claim 1, wherein the purity of the tantalum is 99.999 mass % or higher excluding tungsten and gas components.

10. A tantalum sputtering target, consisting of:
tungsten of a content of 10 to 100 mass ppm;
at least one of molybdenum and niobium of a content greater than 0 mass ppm to 100 mass ppm; and
tantalum;
wherein a total amount of tungsten, molybdenum and niobium within the target is greater than 10 mass ppm to 150 mass ppm or less; and
wherein the purity of the target excluding tungsten, molybdenum, niobium and gas components is 99.998% or more.

11. The tantalum sputtering target according to claim 10, wherein the content of the at least one of molybdenum and niobium is 10 mass ppm or more and 100 mass ppm or less.

12. The tantalum sputtering target according to claim 10, wherein the content of the at least one of molybdenum and niobium is 10 mass ppm or more and 50 mass ppm or less, and wherein the content of tungsten is 10 mass ppm or more and 50 mass ppm or less.

13. The tantalum sputtering target according to claim 10, wherein the contents of tungsten, molybdenum and niobium have a variation within a range from −20% to +20% within the target.

14. The tantalum sputtering target according to claim 10, wherein the tantalum sputtering target has an average crystal grain size of 120 μm or less.

15. The tantalum sputtering target according to claim 14, wherein the average crystal grain size has a variation within a range from −20% to +20% within the target.

16. A tantalum sputtering target consisting of a content of tungsten of 1 mass ppm or more to 100 mass ppm or less, and tantalum having a purity, excluding tungsten and gas components, of 99.999 mass % or more, wherein the content of tungsten has a variation within a range from −20% to +20% within the target.

17. The tantalum sputtering target according to claim 16, wherein the tantalum sputtering target has an average crystal grain size of 120 μm or less.

18. The tantalum sputtering target according to claim 17, wherein the average crystal grain size has a variation within a range from −20% to +20% within the target.

* * * * *